United States Patent Office
3,725,148
Patented Apr. 3, 1973

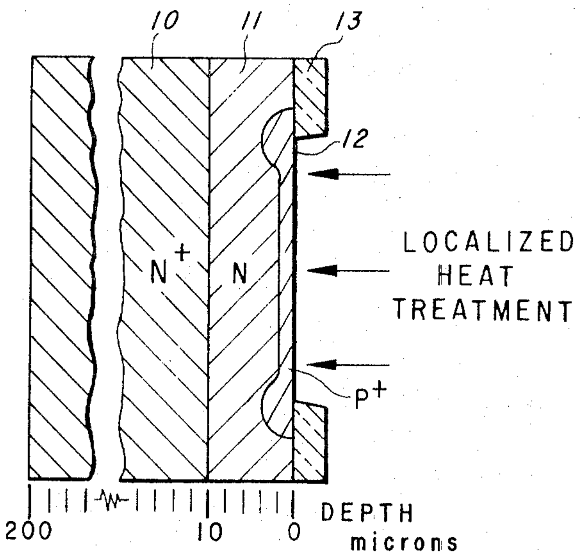
Fig, 1a
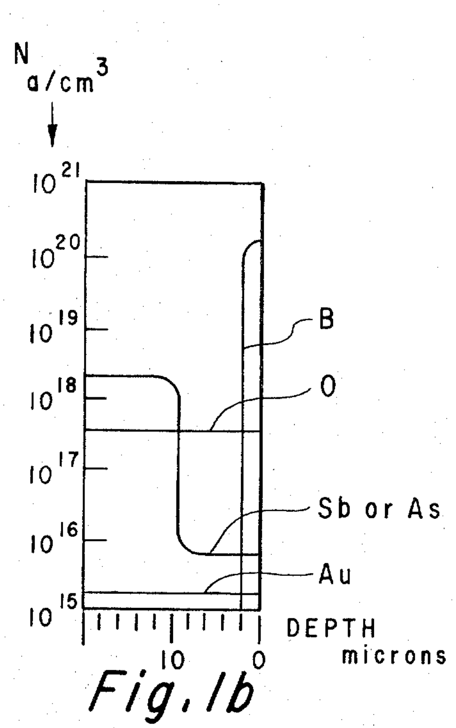
Fig, 1b
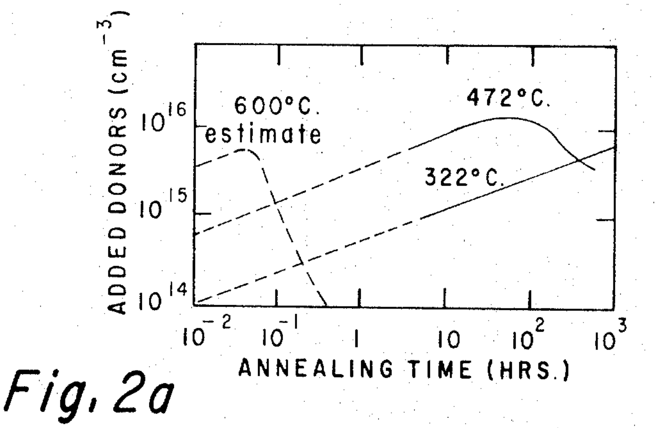
Fig, 2a
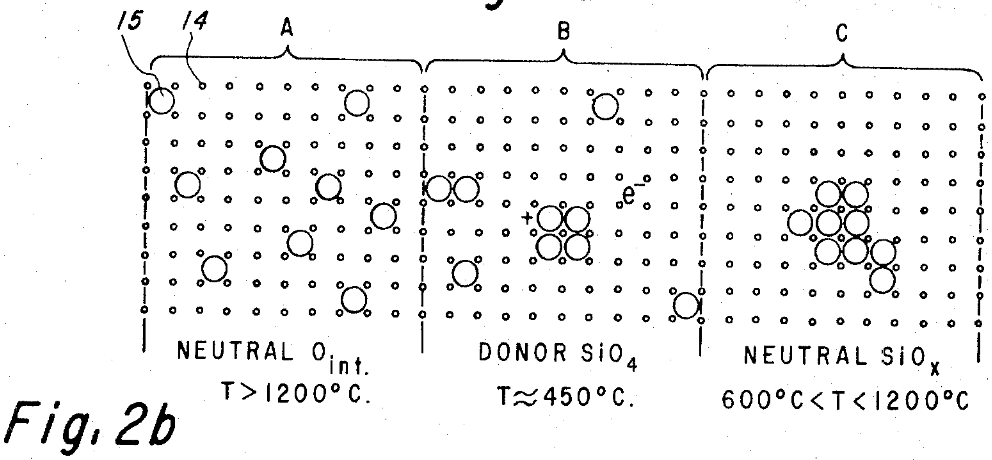
Fig, 2b

3,725,148
INDIVIDUAL DEVICE TUNING USING LOCALIZED SOLID-STATE REACTIONS

Don Leslie Kendall, 608 Kirby, Richardson, Tex.

Filed Aug. 31, 1970, Ser. No. 68,099
Int. Cl. H01l 7/34
U.S. Cl. 148—186 10 Claims

ABSTRACT OF THE DISCLOSURE

The characteristic parameters of an individual semiconductor device in an array or circuit are tuned by localized heat treatment causing solid-state reactions. Neighboring devices, if adequately separated, would be little affected. As a result, devices in an array for example can either be very closely matched or adjusted in an arbitrary or step function fashion from device to device. In an array of diodes fabricated from oxygen doped silicon, for example, current is passed (reverse or forward) through a single diode in an array. If the whole array were at 300° C. and a single $p^+n$ diode was biased to a local temperature of 500° C., the diode would become more n-type, thereby lowering its breakdown voltage. Conversely, an $n^+p$ diode would become less p-type, thereby raising its breakdown voltage.

This invention relates to methods of fabricating semiconductor devices and integrated circuits, and more particularly to methods employing localized heat treatment to adjust the characteristic parameters of a device after fabrication is essentially complete.

This invention further relates to the invention disclosed in copending patent application Ser. No. 68,100, now Pat. No. 3,674,995 for "Computer Controlled Device Testing and Subsequent Arbitrary Adjustment of Device Characteristics" assigned to the assignee of the present invention and filed of even date with the present application.

Present day semiconductor integrated circuits are designed using rather loose tolerances with regard to the characteristic parameters of individual devices across a slice. For example, the gain of a transistor in a typical integrated circuit is generally specified to be within 20–50% of some mean value. The various diffused resistors are presently designed to tolerances of ±20%, and the reverse breakdown voltages are designed with similar variances or are only required to exceed some specified minimum. These limits are generally set from empirically determined results using the best starting material and processing available under current standards in the art.

Integrated circuit manufactures can, to some extent, reduce the above tolerances in characteristic parameters by requiring more uniform starting material in terms of resistivity ($\rho$), dislocation density, oxygen content, and epitaxial layer thickness and impurity distribution. Similar improvements can be made by making the processing more consistent by automation or utilization of ion implantation, for example. However, aside from the increased expense required to achieve such improved tolerances, under the present state of the art, the best results foreseeable are somewhat less than a factor of ten reduction in the range of parameter tolerances.

In addition, the fabrication of neighboring devices in an integrated circuit having widely varying switching times, but otherwise similar characteristics, is presently at most an extremely difficult task. The manufacture of a sequence of devices on a slice having a linear progression of switching times ranging from say 5 nanoseconds to 24 nanoseconds in precise increments of 1 nanosecond, for example, would be virtually impossible using previously known techniques in the art.

It is therefore an object of the present invention to provide a method of arbitrarily adjusting or tuning the characteristic parameters of each individual device of an integrated circuit.

Another object of the invention is to provide a method of fabricating integrated circuits with yields approaching 100% and with individual devices thereof matched to characteristic parameter tolerances of 1% or better.

Still another object of the invention is to provide a method of adjusting the characteristic parameters of each device of an integrated circuit to produce parameter matched arrays or to do custom design after fabrication of the integrated circuit is essentially complete.

These and other objects and advantages are achieved in accordance with the present invention by providing a method of arbitrarily adjusting the characteristic parameters of each individual semiconductor device of an integrated circuit by localized heat treatment causing solid-state reactions.

The method employs localized heat treatment provided by an electron beam, a heat or current probe, or a laser beam. In one embodiment, the localized heat treatment is combined with automatic parameter testing to derive individual device characteristic information such as breakdown voltage, leakage and switching time. From such derived information the difference between actual parameters and desired parameters is calculated and a signal generated to heat the device and thereby change its characteristic properties. If breakdown voltage is too low, for example, increased heat intensity raises the temperature locally and shifts the material toward n-type if done at about 500° C. In an $n^+p$ diode, this would increase breakdown voltage.

As a result, devices in an array or integrated circuit can either be very closely matched or adjusted in an arbitrary or step function fashion from device to device. Neighboring devices, if adequately separated, would be little affected.

Still further objects and advantages of the invention will be apparent from the detailed description and claims and from the accompanying drawings wherein:

FIG. 1*a* illustrates a semiconductor $p^+n$ junction diode which is to be locally heat treated in accordance with the method of the present invention.

FIG. 1*b* illustrates a typical doping profile through the center of the diode of FIG. 1*a*.

FIGS. 2*a* and 2*b* illustrate the oxygen donor reaction as it affects resistivity in accordance with the method of the invention.

Figure 3:
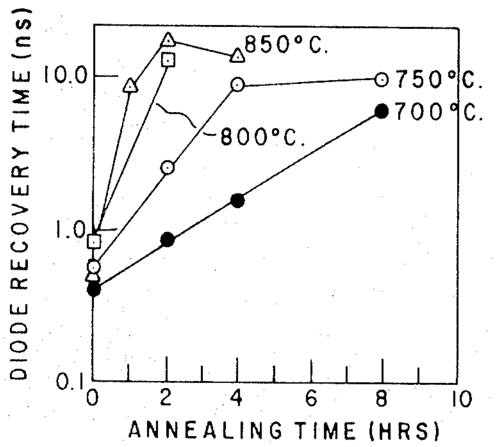
FIG. 3 is a graph illustrating the gold precipitation reaction as it affects diode recovery time in accordance with the invention.

Referring then to the drawings, FIG. 1*a* illustrates a semiconductor p-n junction device which is locally treated in accordance with the method of the present invention. Basically, the p-n junction is formed according to a standard method utilized in the semiconductor art such as alloying, diffusing or growing of an epitaxial layer. Illustrated is a semiconductor body having $n^+$-type substrate 10, n-type layer 11 and $p^+$-type region 12. Layer 13 is insulating material with an opening defining the position of the device. Then, at some time after the device has been fabricated, various parameters of the junction are altered or tuned by the selective application of heat causing a desired semiconductor reaction. The heat may be applied to alter the junction parameters uniformly across the junction or only in various desired locations. Although FIG. 1*a* shows a single p-n junction, the method of the invention applies to all semiconductor devices and therefore provides means for changing the parameters of resistors, diodes and transistors, whether fabricated as discrete devices or as part of any array or integrated circuit, and the heat treatment applied after fabrication of the device, array or circuit is essentially complete.

A typical semiconductor doping concentration profile for the $p^+$-n junction device of FIG. 1*a* is illustrated in FIG. 1*b*. The silicon slice from which the device was fabricated is shown to be a Czochralski slice with an oxygen concentration ($N_0$) of between about $3\times10^{17}$ and $10^{18}$ $cm.^{-3}$ but may have been a Lopex slice with an oxygen concentration of between about $10^{16}$ and $3\times10^{16}$ $cm.^{-3}$ or other. The gold (Au) impurity, which is used to control the minority carrier lifetime of silicon for diodes and transistors, has a concentration of about $2\times10^{15}$ $cm.^{-3}$. Substrate portion 10 is heavily doped with antimony (Sb) or arsenic (As) to a concentration of about $2\times10^{18}$ to provide an $n^+$-type material and layer 11 is doped with antimony or arsenic to a concentration of about $5\times10^{15}$ $cm.^{-3}$ to provide an n-type layer on substrate 10. Finally, region 12 is doped with boron (B) to a concentration of about $10^{20}$ $cm.^{-3}$.

Other doping materials could be utilized, each having its own solid state reaction when heat treated in accordance with the present invention. For purposes of this description, however, only the oxygen and gold reactions will be discussed in detail, as it is a common occurrence for a silicon slice to contain both of these materials. Furthermore, heat treatment of such a slice in accordance with the present invention to affect an oxygen donor reaction and thereby primarily change the resistivity ($\rho$) of the material is independent of heat tretament of the slice to affect a gold precipitation reaction which primarily changes the minority carrier lifetme ($\tau$). Specfically, the oxygen reaction primarily occurs at a temperature of between about 300°–600° C. while the gold reaction primarily occurs at a temperature of between about 600°–900° C. It should be noted that both reactions occur at 600° C. The oxygen reaction may take place at 600° C., for example, when the heat is applied for a very short time interval <1.8 min. Although the gold reaction occurs at that temperature, the necessary time interval to make any appreciable change in minority carrier lifetime at 600° C. would be considerably greater than 1.8 min.

The oxygen donor reaction may be better understood with reference to FIGS. 2*a* and 2*b*. Illustrated in FIG. 2*a* is a graph showing added oxygen donor concentration as the semiconductor material is heated for a certain length of time at a specific temperature. For example, at 600° C., from $3\times10^{15}$–$5\times10^{15}$ donors per $cm.^3$ may be added to the present donor concentration of a slice by heating it for about 0.6–3.6 min. This reaction is represented in FIG. 2*b* by section B of a silicon crystal lattice having silicon atoms 14 and oxygen atoms 15 where donor $SiO_4$ is formed freeing an electron. If heated at 600° C. for an appreciably longer period of time or at a tempertaure between 600° and 1200° C. (time period being dependent on the temperature) the reaction represented by section C for the crystal lattice where neutral $SiO_x$ occurs ($x$ being greater than 4). Thus, the reaction occurring at this tmperature range can be used to extract donors and raise the resistivity of an n-type region. As represented in section A of the crystal lattice, isolated neutral oxygen atoms which are interstitial with respect to the silicon lattice are formed if the silicon is heated to a temperature beyond 1200° C. It should be noted that, in performing the method of localized heat treatment to perform reaction B in accordance with the present invention, it is preferable to begin with a slice which has first been annealed for an extended period of time at a temperature above 1200° C. so that the reaction at section A will take place. This is because it requires less energy to convert the isolated oxygen atoms to $SiO_4$ than to convert the $SiO_x$ complexes to $SiO_4$. That does not eliminate the use of a slice which has been annealed at a temperature between 600° and 1200° C. although such reaction would take somewhat longer than the above example would indicate.

An example of an oxygen donor reaction is shown below with reference to Equations 1–10. The effect of the gold concentration on resistivity is ignored here for simplicity. If the gold were all electrically active, that is, not precipitated, it would tend to raise the resistivity and breakdown voltages somewhat. The basc reaction, however, would be quite similar. $\rho_n$ is the resistivity of an n-type semiconductor material. $n$ is equal to the density of electrons in conduction band. $N_D^+$ is equal to the density of donor impurity atoms (other than oxygen donors) and $N_{OD}^+$ is equal to the density of electrically active oxygen donor complexes. $\mu_n$ is the electron mobility (1200 $cm.^2$ $volts^{-1}$ $sec^{-1}$) and q is the electron charge ($1.6\times10^{-19}$ coulombs). The resistivity of the n-type material may be approximated as follows:

(1) $$\rho_n=1/nq\mu_n$$

(2) $$\rho_n=1/N_D^++N_{OD}^+)q\mu_n$$

Let us assume for purposes of this example that the donor concentration $N_D^+$ of layer 11 (FIG. 1*a*) is:

(3) $$N_D^+\simeq5\times10^{15}\ cm.^{-3}$$

and the oxygen donor concentration $N_{OD}^+$ is:

(4) $$N_{OD}^+\simeq10^{14}\ cm.^{-3}$$

According to Equation 2:

(5) $$\rho_n\simeq1.02\ \Omega cm.$$

and from standard tables (see W. R. Runyan, Silicon Semiconductor Technology, FIGS. 8–23, McGraw-Hill Book Company) bulk breakdown voltage ($V_b$) is (6) $$V_b=100\ volts$$

Now, in accordance with the heat treatment method of the present invention, when heat is applied to the device (as illustrated in FIG. 1*a*) at a temperature of 500° C. for 1 min. approximately $10^{15}$ $cm.^{-3}$ are added to the original oxygen donor concentration (see FIG. 2*a*). Thus:

(7) $$N_{OD}^+\simeq10^{14}\ cm.^{-3}\ \frac{H.T.\ 500°\ C.}{1\ min.}\ 1.1\times10^{15}\ cm.^{-3}$$

The total electron density is now:

(8) $$n\simeq6.1\times10^{15}$$

and the resistivity of the n-type material (layer 11 in FIG. 1*a*) has been changed to:

(9) $$\rho_n\simeq0.85\ \Omega cm.$$

so that bulk breakdown voltage is now:

(10) $$V_b\simeq90\ volts$$

It should be noted, that in the above example the diode was tuned to decrease bulk breakdown voltage. The guardring diffusion near the edge of layer 12 in FIG. 1*a* is one method of ensuring that bulk breakdown rather than edge breakdown will be the determining breakdown factor of the device. In an $n^+p$ diode the bulk breakdown voltage would have been increased by the applied heat treatment. On the other hand, the above $p^+n$ diode could also have had its bulk breakdown voltage increased slightly by heat treatment of the diode at 600° C., for example, for a time period greater than one hour (according to reaction C of FIG. 2*b*).

In applying this heat treatment method to diffused resistors, the carrier concentration is often too high for the resistivity to be affected significantly by the oxygen donor reaction. This can be obviated, however, by a deeper diffusion so that the average resistivity goes up. This would increase the variability in sheet resistance, $R_s$, but would render the diffused resistors susceptible to local heat treatments of the type discussed above.

As a second embodiment of the present invention, the gold precipitation reaction will now be discussed in detail with reference to FIG. 3. The most desired effect of this reaction is the changing of minority carrier lifetime ($\tau$), although the reaction may also affect resistivity and other related device and circuit parameters to some extent. Where both heat treatments are to be used, it is therefore preferable to perform the gold heat treatment first, and then perform the heat treatment for the oxygen donor reaction so that a final resistivity adjustment is made. Illustrated in FIG. 3 is a graph showing how diode recovery time ($t_r$, and similarly transistor switching time $t_s$) is affected by heat treatment in accordance with the present invention on $p^+n$ diodes having about $2\times10^{16}$ cm.$^{-3}$ gold concentrations. According to the graph of FIG. 3, recovery time increases exponentially with heat treatment time (annealing time).

If $N_{Au(s)}$ is the concentration of gold in substitutional sites, the recovery time of a gold-doped diode (such as the diode illustrated in FIG. 1*a*) is given by the equation:

(11) $$t_r=\text{const}/N_{Au(s)}$$

The following equation is therefore an empirical description of the concentration of this substitutional gold during the heat treatment:

(12) $$N_{Au(s)}=N_{Au(s)_0}e^{-t/\tau_{H.T.}}$$

where $N_{Au(s)_0}$ is the initial concentration of substitutional gold, $t$ is time, and $\tau_{H.T.}$ is a time constant for the heat treatment process. From the chart of FIG. 3, $\tau_{H.T.}$ can be found for each annealing temperature, and is the time in which $t_r$ increases by a factor of $e$ (2.72). An Arrhenius plot of log $\tau_{H.T.}$ versus $1/T$ is a straight line, and hence $\tau_{H.T.}$ can be empirically written:

(13) $$\tau_{H.T.}=\tau_{H.T._0}e^{H/kT}$$

where $k$ is Boltzmann's constant, T is the absolute temperature, H is the activation energy, and $\tau_{H.T_0}$ is the pre-exponential factor derived from the plot of $\tau_r$ versus $1/T$. From the data of FIG. 3, H is 1.36 ev. and $\tau_{H.T._0}=10^{-3}$ seconds.

For the diode of FIG. 1*a* then, the gold concentration is:

(14) $$N_{Au}=2\times10^{15}\text{ cm.}^{-3}$$

Since the graph of FIG. 3 is for a diode having a gold concentration of $2\times10^{16}$ cm.$^{-3}$ and since $t_r$ is inversely proportional to $N_{Au(s)}$ from Equation 11, a graph for the concentration expressed in Equation 12 may be interpolated by multiplying the vertical axis of the graph of FIG. 3 by a factor of 10. Thus, the diode recovery time for the diode of FIG. 1*a* is about 8 ns. Now, in accordance with the heat treatment method of the present invention, when heat is applied to the device at a temperature of 800° C. for 30 minutes the diode recovery time increases as follows:

(15) $$t_r\simeq 8\text{ ns.}\ \frac{H.T.\ 800°\,C.}{30\text{ min.}}\ 20\text{ ns.}$$

Although the utility of solid state reactions that occur below typical impurity diffusion temperatures has been emphasized, it is clear that localized diffusion of high temperature diffusants can also be accomplished by these same methods. Using such a process it would be possible, for example, to adjust the p-n junction depth of a $p^+nn^+$ diode such as that shown in FIGS. 1*a* and 1*b*. Thus one might compensate for local epitaxial thickness variations of the n-layer shown. This would be important in a set of diodes whose breakdown voltages were controlled primarily by the epitaxial layer thickness rather than the resistivity of the n-layer, that is, in diodes that were "punch-through limited."

Figure 4:
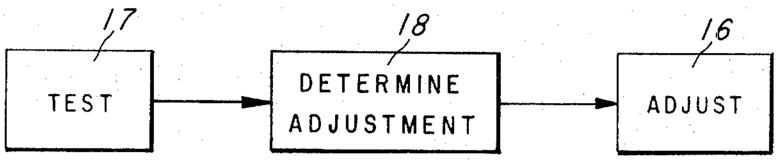
FIGS. 4–8 illustrate specific methods embodied in the present invention for carrying out the local heat treatment reactions.

Now that certain solid state reactions caused by localized heat treatment have been discussed in detail, specific methods embodied in the present invention for carrying out this heat treatment will next be disclosed. Referring then to FIG. 4, one embodiment of the invention combines the heat streatment step 16 for the arbitrary adjustment of device characteristics with parameter testing step 17. Thus, the devices are tested, the difference between the actual device parameters and desired device parameters is determined and then the device parameters are adjusted by the application of heat in accordance with the present invention as determined by the determined difference. In the embodiment illustrated in FIG. 4, determination step 18 has been added to perform the necessary difference which may be performed in a properly programmed analog or digital computer. In such embodiment, the test information is converted directly into information from which the computer can make its calculations and then the computer provides a direct output signal for the adjustment operation. In this way, a plurality of devices fabricated on a single semiconductor slice are automatically adjusted to have a desired set of characteristics prior to their separation, already separated devices are automatically tested and adjusted when carried in conveyer fashion from a station where test step 17 is performed to a station where adjustment step 16 is performed and devices in an array or integrated circuit are either very closely matched or adjusted in an arbitrary or step function fashion from device to device.

Several methods are embodied in the present invention to perform the actual steps of testing and heat treatment adjusting. For example, with reference to FIG. 5, diodes in an array having a plurality of regions 20 of one conductivity type formed on a substrate 19 of opposite conductivity type and having contacts 22 capable of withstanding the heat treatment formed in openings of insulating layer 21 to make electrical connection with regions 20, may be tested by passing a small electrical current through probe 23 to generate a signal so that determination step 18 of the method of FIG. 4 can be performed. Simultaneously or sequentially, a high current signal is applied to electric current heater 24 to perform heat adjustment step 16 and thereby adjust the characteristics of another diode in the array which had been previously tested and the necessary difference for it determined. Thus, a higher current is passed through the diode for a determined period of time which is enough to raise the temperature of the diode and thereby perform the desired solid state reaction in accordance with the heat treatment method of the invention. Neighboring diodes in the array are adequately separated so that they are not affected by the heat developed at the diode being adjusted. Next, either test probe 23 and heat probe 24 or substrate 19 is moved so that a device already tested is placed under heat probe 24 for adjustment and a yet untested device is placed under test probe 23.

Figure 5:
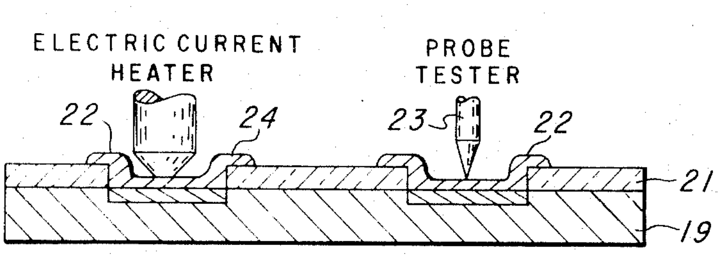
Figure 6:
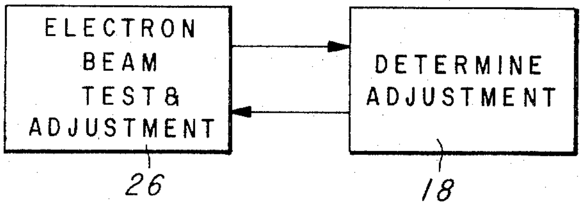

Referring to FIG. 6, another method of heating a diode in the array of FIG. 5 to perform a desired solid state reaction in accordance with the invention, after the device has been tested, is to apply the heat of a laser beam 25 of calculated intensity for the correct period of time before forming contacts 22 or after forming contacts 22 if the contact is designed to withstand the temperatures involved.

Figure 7:
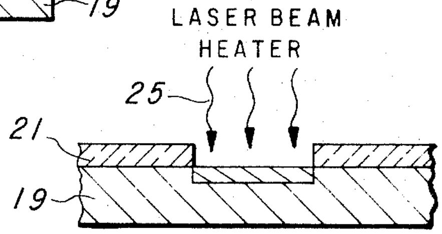

Still a further method of testing a device, calculating the difference between actual measured parameters and desired parameters and then adjusting the device parameters in accordance with the derived calculations is illustrated in FIG. 7. In this embodiment, the device is both tested and adjusted in step 26 by an electron beam. The difference determination at step 18 are made from electrical signals derived from the semiconductor slice when a low intensity electron beam is passed over the devices and then the intensity and on-time of the electron beam is controlled to heat the device and thereby perform the desired solid state reaction. The beam may be scanned across the slice twice, first testing all devices and then adjusting all devices. Or, the beam may be tuned in to focus on each device on the slice, testing and adjusting the particular device and then tuned in to focus on another device.

Figure 8:
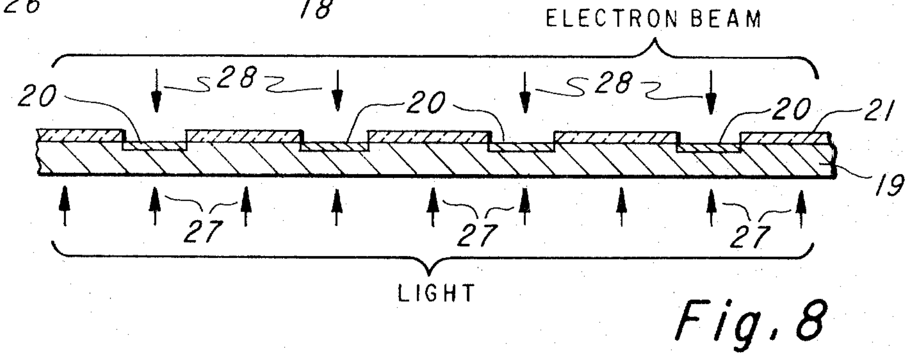

The electron beam method of heat treatment may be better understood with reference to FIG. 8. Illustrated in FIG. 8 is the array of diodes formed by substrate 19 of one conductivity type and regions 20 of opposite conductivity type. Again, layer 20 is insulating material having openings defining the diodes. When electron beam 28 is tuned on a device at a low intensity, a dark current is generated in substrate 19 which is measurable and from which parameters such as resistivity can be found. Evenly distributed light 27 is applied to the reverse side of substrate 19 as shown to measure minority carrier lifetime in a similar manner. The difference between these measured parameters and desired parameters then determines the intensity and time period which electron beam 28 must be played back on the device being tuned. Electron beam 28 is thus again utilized, now however, for the purpose of providing the necessary heat treatment in accordance with the invention to perform the desired solid state reaction. In some embodiments, a separate high current electron beam is utilized in the adjustment mode as compared to the low current test beam.

In still a further embodiment of the method of the invention, only the edges of a junction such as the junction of an $n^+p$ diode, for example, are heated to essentially eliminate edge breakdown of the junction. Edge breakdown where a junction edge meets the surface of a device is a result of non-ideal surface conditions. It is therefore important to reduce the electric field at the surface as much as possible. In accordance with the method of the invention, heat is applied only to the junction edge along the perimeter defined on the surface of the device, causing the resistivity of the p-type material in that region to go much higher than the resistivity of the bulk of the p-type material. When a reverse bias is applied to the resulting structure, the equipotential lines move further out in the higher resistivity region, and hence the field near the surface is reduced and edge breakdown essentially eliminated.

Although significant detail has been placed on devices such as diodes in an array, for example, the system has equal ability to tune an integrated circuit to a given offset voltage or other parameter by the above techniques. Thus, though in many digital circuits of modern design, the tolerable variations are quite large, the final circuit can be tuned by local heat treatment of any of the discrete devices in the circuit. The diffused resistor values, for example, may be the most critical individual parameters in a given circuit, and a final adjustment of these resistors may be enough to bring the total circuit to a given specification.

Several embodiments of the method of the invention have now been described in detail. It is to be noted, however, that these descriptions of specific embodiments are merely illustrative of the principles underlying the inventive concept. It is contemplated that various modifications of the distinct embodiment, as well as other embodiments of the invention, will, without departing from the spirit and scope of the invention, be apparent to persons skilled in the art.

What is claimed is:

1. A method of increasing minority carrier lifetime of one or more preselected semiconductor electronic devices in a semiconductor array or integrated circuit wherein said one or more devices are comprised of gold doped silicon having at least on p-n junction to thereby provide a gold doping profile, comprising the step of altering said doping profile by independently heating said one or more devices to a temperature between about 600° C. and 1100° C., thereby increasing minority carrier lifetime in said one or more devices.

2. A method of decreasing the bulk breakdown voltage of a silicon semiconductor $p^+n$ diode having an oxygen doped n-type region comprising the step of heating said diode to a temperature between about 300° C. and 600° C.

3. The method of claim 2 wherein said diode is fabricated with one or more other semiconductor electronic devices on a single semiconductor substrate and said diode is independently heated.

4. A method of increasing the bulk breakdown voltage of a silicon semiconductor $n^+p$ diode having an oxygen-doped p-type region comprising the step of heating said diode to a temperature between about 300° C. and 600° C.

5. The method of claim 4 wherein said diode is fabricated with one or more other semiconductor electronic devices on a single semiconductor substrate and said diode is independently heated.

6. A method of increasing the bulk breakdown voltage of a silicon semiconductor $p^+n$ diode having an oxygen-doped n-type region comprising the step of heating said diode to a temperature between about 600° C. and 1200°C .

7. The method of claim 6 wherein said diode is fabricated with one or more other semiconductor electronic devices on a single semiconductor substrate and said diode is independently heated.

8. A method of decreasing the bulk breakdown voltage of a silicon semiconductor $n^+p$ diode having an oxygen-doped n-type region comprising the step of heating said diode to a temperature between about 600° C. and 1200° C.

9. The method of claim 8 wherein said diode is fabricated with one or more other semiconductor electronic devices on a single semiconductor substrate and said diode is independently heated.

10. A method of eliminating the effect of edge breakdown of a silicon $n^+p$ diode having an oxygen doped p-type region, comprising the step of heating only the surface junction edges of said diode to a temperature between 300° C. and 600° C.

References Cited

UNITED STATES PATENTS

| | | | |
|---|---|---|---|
| 3,272,661 | 9/1966 | Tomono et al. | 148—1.5 |
| 3,458,368 | 7/1969 | Haberecht | 148—15 UX |
| 3,445,924 | 5/1969 | Cheroff et al. | 148—1.5 X |
| 3,420,719 | 1/1969 | Potts | 148—186 |
| 3,156,592 | 11/1964 | Zuleeg | 148—183 |
| 2,894,184 | 7/1959 | Veech et al. | 29—584 |
| 3,487,301 | 12/1969 | Gardner et al. | 317—235 V |

OSCAR R. VERTIZ, Primary Examiner

J. COOPER, Assistant Examiner

U.S. Cl. X.R.

148—1.5; 317—235 R